United States Patent
Yoo et al.

(10) Patent No.: US 6,768,363 B2
(45) Date of Patent: Jul. 27, 2004

(54) OUTPUT DRIVER CIRCUIT FOR CONTROLLING UP-SLEW RATE AND DOWN-SLEW RATE INDEPENDENTLY AND UP-DRIVING STRENGTH AND DOWN-DRIVING STRENGTH INDEPENDENTLY

(75) Inventors: Chang-sik Yoo, Seoul (KR); Byong-mo Moon, Seoul (KR)

(73) Assignee: Samsung Electronics, Co. Ltd., Suwon (KR)

( * ) Notice: Subject to any disclaimer, the term of this patent is extended or adjusted under 35 U.S.C. 154(b) by 0 days.

(21) Appl. No.: 10/330,363

(22) Filed: Dec. 30, 2002

(65) Prior Publication Data

US 2003/0189446 A1 Oct. 9, 2003

(30) Foreign Application Priority Data

Apr. 3, 2002 (KR) ........................................ 2002-18249

(51) Int. Cl.[7] .............................................. H03K 19/00
(52) U.S. Cl. ....................... 327/170; 327/112; 327/108; 326/56
(58) Field of Search ................................ 327/112, 108, 327/170, 332, 333, 538; 326/56, 27, 57

(56) References Cited

U.S. PATENT DOCUMENTS

| | | | |
|---|---|---|---|
| 5,568,081 A | | 10/1996 | Lui et al. .................... 327/380 |
| 5,600,271 A | * | 2/1997 | Erickson et al. ............. 327/108 |
| 5,877,647 A | | 3/1999 | Vajapey et al. .............. 327/391 |
| 6,329,836 B1 | * | 12/2001 | Drost et al. ................... 326/30 |
| 6,489,807 B2 | * | 12/2002 | Genna et al. ................ 327/170 |
| 6,646,483 B2 | * | 11/2003 | Shin ............................ 327/112 |

OTHER PUBLICATIONS

Korean Search Report and translation.

* cited by examiner

*Primary Examiner*—Dinh T. Le
(74) *Attorney, Agent, or Firm*—Harness Dickey

(57) ABSTRACT

An output driver circuit includes a push-pull driver for driving an output signal of a semiconductor device to one of two voltage levels corresponding to a determined data state. The push-pull driver includes a pull-up driving circuit for driving the output signal toward a first voltage level when the data state is logic "high," and a pull-down driving circuit for driving the output signal to a second voltage level when the data state is "low." The strength with which the pull-up driving circuit drives the voltage level of the output signal toward the first output voltage level can be controlled independently of the strength with which the pull-down driving circuit drives the voltage level of the output signal toward the second output voltage level. The rate at which the pull-up driving circuit drives the output signal voltage level from a "low" data state to a "high" data state can also be controlled independently of the rate at which the pull-down driving circuit drives the output signal voltage level from the "high" data state to the "low" data state.

37 Claims, 8 Drawing Sheets

OUTPUT DRIVER CIRCUIT FOR CONTROLLING UP-SLEW RATE AND DOWN-SLEW RATE INDEPENDENTLY AND UP-DRIVING STRENGTH AND DOWN-DRIVING STRENGTH INDEPENDENTLY

RELATED APPLICATION

This application claims the benefit of priority under 35 U.S.C. § 119(a) of Korean Patent Application No. 02-18249, filed on Apr. 3, 2002, the contents of which are hereby incorporated by reference in their entirety.

BACKGROUND OF THE INVENTION

1. Field of the Invention

The present invention relates to the field of semiconductor devices, and more particularly, to an output driver circuit in a semiconductor device.

2. Description of the Related Art

An output driver circuit in a semiconductor device (e.g., an integrated circuit) is used to output a signal representing an internal data state of the device through an output terminal, for example, through an output pad. One type of output driver employed in semiconductor device is a push-pull driver. Output push-pull drivers are used to control the voltage level of the output signal by setting a driving strength, and to control the slew rate of the output signal.

The driving strength of an output signal represents a strength at which the output signal is driven toward the voltage level of a particular source voltage (e.g., a power supply voltage or a ground voltage). Specifically, the driving strength determines how close to the voltage level of the particular source voltage the output signal will be driven. As a driving strength increases, the push-pull driver drives the voltage level of the output signal more closely to the voltage level of the source voltage.

The driving strength of an output push-pull driver is defined in terms of a pull-up driving strength and a pull-down driving strength. The pull-up driving strength refers to the strength at which the voltage level of an output signal is driven toward a voltage level corresponding to a "high" logic level, or data state, while the pull-down driving strength refers to the strength at which the voltage level of an output signal is driven toward a voltage level corresponding to a "low" logic level. For example, the voltage levels corresponding to the high and low data states may be those of a power supply voltage and a ground voltage, respectively.

A slew rate of an output driving circuit represents how quickly the voltage level of an output signal changes from one data state to the other. The slew rate can be understood as a slope of an output signal's voltage level with respect to time. An up-slew rate corresponds to the slope of an output signal switching from a low level to a high level, while a down-slew rate corresponds to the slope of an output signal switching from a high level to a low level. Higher slew rates are indicated by steeper the slopes. That is, when the slew rate increases, the voltage level of an output signal changes within a shorter period of time.

A high slew rate is advantageous for an output push-pull driver in terms of data skew, but disadvantageous in terms of noise. Lowering the slew rate of an output push-pull driver decreases noise associated with the output signal, but increases data skew.

In addition, the output terminals of several semiconductor devices (e.g., memory chips) may be connected to a single data bus (e.g., a memory bus). In such situations, the output data currently being transmitted over the bus by one of the semiconductor devices may be adversely affected by a non-transmitting semiconductor device, based on the last voltage level at which the non-transmitting device's output signal was driven.

SUMMARY OF THE INVENTION

The present invention is directed to an output driver circuit in a semiconductor device including a push-pull driver, in which the operation of driving the voltage level of an output signal to a "high" voltage level is controlled independently from the operation of driving the voltage level of the output signal to a "low" voltage level. Specifically, the push-pull driver includes one or more pull-up units for driving the signal toward a first voltage level corresponding to a high data state, and one or more pull-down units for driving the signal towards a second voltage level corresponding to a low data state. The pull-up units are controlled by one or more pull-up control signals, while the pull-down units are controlled by one or more pull-down control signals.

In an exemplary embodiment, the pull-up control signals include one or more up-driving strength control signals, and the pull-down control signals include one or more down-driving strength control signals. The up-driving strength control signals control the pull-up strength at which the pull-up units drive the output signal. Accordingly, the up-driving strength control signals allow an output signal corresponding to a high data state to be set at a desired voltage level. Similarly, the down-driving strength control signals set the desired voltage level of an output signal corresponding to a low data state, by controlling the pull-down strength for the pull-down units.

According to a further exemplary embodiment, the pull-up control signals include an up-slew rate control signal, and the pull-down control signals include a down-slew rate control signal. The up-slew rate control signal controls the operation of the pull-up units in order to set the up-slew rate of the output signal to a desired rate. The down-slew control signal controls the operation of the pull-down units in order to set the down-slew rate of the output signal to a desired rate. Therefore, the up-slew rate and down-slew rate of the push-pull driver can be independently controlled.

In a further exemplary embodiment, the output driver of the present invention may enter a "tri-state" when the semiconductor chip is not currently outputting data. Accordingly, an output enable signal is used to enable the output driver to generate an output signal, or to set the output driver in a tri-state.

Specifically, when the semiconductor chip outputs data, the output enable signal is activated and the output driver generates an output signal whose voltage level corresponds to the internal data state of the semiconductor chip. When the output enable signal is not activated, neither the set of pull-up units nor the set of pull-down units drive the output signal toward the first or second voltage level, respectively. Accordingly, the output driver generates an output signal whose voltage level corresponds to the tri-state. In other words, the voltage level of the output signal is sufficiently lower than the level corresponding to the high data state, and sufficiently higher than the level corresponding to a low data state, thus indicating a "no data" state.

In a further exemplary embodiment, the output driver is controlled to enter into, and exit from, the tri-state in synchronization with the generation of output data by the semiconductor device, based on an internal clock signal of the semiconductor device. Such synchronization helps prevent a situation in which the output driver departs the tri-state before the output data is prepared, thereby causing the semiconductor device to output erroneous data. Also, a situation can be avoided where the output driver exits the tri-state too late, causing the semiconductor device to output data after an expected time.

BRIEF DESCRIPTION OF THE DRAWINGS

The above and other features of the present invention will become readily apparent from the description of the exemplary embodiments that follows, with reference to the attached drawings in which.

DETAILED DESCRIPTION OF THE INVENTION

Figure 1:
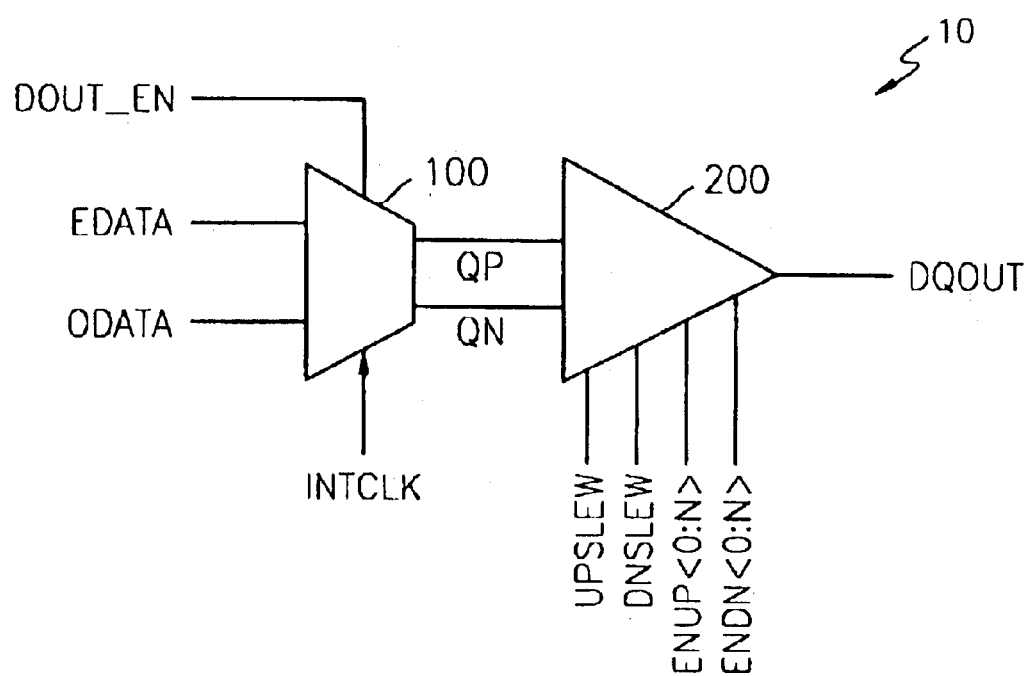
FIG. 1 is a schematic block diagram illustrating an output driver circuit according to an embodiment of the present invention.

Referring to FIG. 1, an output driver circuit 10 according to an exemplary embodiment of the present invention includes a pre-driver 100 and a push-pull driver 200. The pre-driver 100 produces first and second data signals QP and QN, which are sent to the push-pull driver 200 to determine the data state of the output signal DQOUT, and control the tri-state of the push-pull driver 200.

According to an exemplary embodiment, the first and second data signals QP and QN may be used to communicate an internal data state of a semiconductor device to the push-pull driver 200. The internal data state corresponds to the logic level (either high H or low L) of the data to be output from the semiconductor device. The current internal data state may be determined according to internal data signals generated by the semiconductor device.

In a further exemplary embodiment, the pre-driver 100 can have the function of converting a data rate of the semiconductor device, in addition to the above functions. Specifically, the pre-driver 100 may convert the data rate by generating an output signal whose data rate is double the rate at which the semiconductor device generates internal data signals.

According to this embodiment, the semiconductor device generates two internal data signals EDATA and ODATA. For example, the data signal EDATA corresponds to the internal data state of the semiconductor device during the first half-period of each clock cycle of internal clock signal INTCLK (i.e., when INTCLK is at a high logic level H), while the data signal ODATA corresponds to the internal data state during the second half-period of each clock cycle of INTCLK (i.e., when INTCLK is at a low logic level L). The pre-driver 100 receives the internal data signals EDATA and ODATA, and produces the first and second data signals QP and QN.

The conversion of data rate by the pre-driver 100 lowers the signal frequency within a semiconductor chip, thus enhancing performance and simplifying design issues. It should be noted, however, that the conversion function of the pre-driver 100 is not essential to implementing the basic concept of the present invention. Accordingly, in an alternative embodiment, the pre-driver generates the first and second data signals QP and QN based on the data state of only one internal data signal. However, for purposes of illustration only, the pre-driver 100 and other elements of the output driver 10 will be described below in connection with the embodiment employing the data rate conversion function of the pre-driver.

The pre-driver 100 generates the first and second data signals QP and QN based on the received internal data signals EDATA and ODATA, and the output enable signal $DOUT_{13}$ EN, in synchronization with the internal clock signal INTCLK. The output enable signal DOUT_EN is a signal for controlling a tristate of the output driver 10. When the output driver 10 is in the tri-state, the output enable signal DOUT_EN is set to logic low L to render the push-pull driver 200 in a high impedance state, thereby preventing the push-pull driver 200 from driving the output signal DQOUT.

As described above, the pre-driver 100 produces the first and second data OP and QN by selecting the even data EDATA when the internal clock signal INTCLK is in a logic high state H. Subsequently, the pre-driver 100 produces the first and second data QP and QN by selecting the odd data ODATA when the internal clock signal INTCLK is in a logic low state L. The structure and operation of the pre-driver 100 will be described later in more detail below with respect to FIG. 3.

The push-pull driver 200 receives the first and second data QP and QN from the pre-driver 100 and produces an output signal DQOUT. According to one embodiment, the operation of the push-pull driver 200 may be controlled by a set of control signals including an up-slew rate control signal UPSLEW, a down-slew rate control signal DNSLEW, an up-driving strength control signal ENUP<0:N> and a down-driving strength control signal ENDN<0:N>.

The up-slew rate control signal UPSLEW is an analog signal that controls the rising slew rate, i.e., the up-slew rate, of the output signal DQOUT. The down-slew rate control signal DNSLEW is an analog signal that controls the falling slew rate, i.e., the down-slew rate, of the output signal DQOUT.

The up-driving strength control signal ENUP<0:N> may comprise a digital control code of (N+1) bits, which controls the strength at which the push-pull driver 200 drives the output voltage level of the output signal DQOUT toward a first output voltage level. Each of the (N+1) bits may be a separate binary signal received by the push-pull driver 200. Accordingly, the up-driving control signal ENUP<0:N> may be received as a set of (N+1) up-driving strength control signals, the combination of which forms a binary value representing the overall pull-up strength of the push-pull driver 200.

The down-driving strength control signal ENDN<0:N> may be a digital control code of (N+1) bits, which controls the strength at which the push-pull driver 200 drives the output voltage level of the output signal DQOUT towards a second output voltage level. Similar to the up-driving control signal ENUP<0:N>, each of the (N+1) bits of the down-driving strength control signal ENDN<0:N> may be a separate binary signal. Therefore, the down-driving strength control signal may be received as a set of (N+1) down-driving strength control signals, the combination of which forms a binary value representing the overall pull-down strength of the push-pull driver 200.

Preferably, the first output voltage level corresponds to a voltage level of a power supply voltage VDD, while the second output voltage level corresponds to a ground voltage level VSS.

Figure 2:
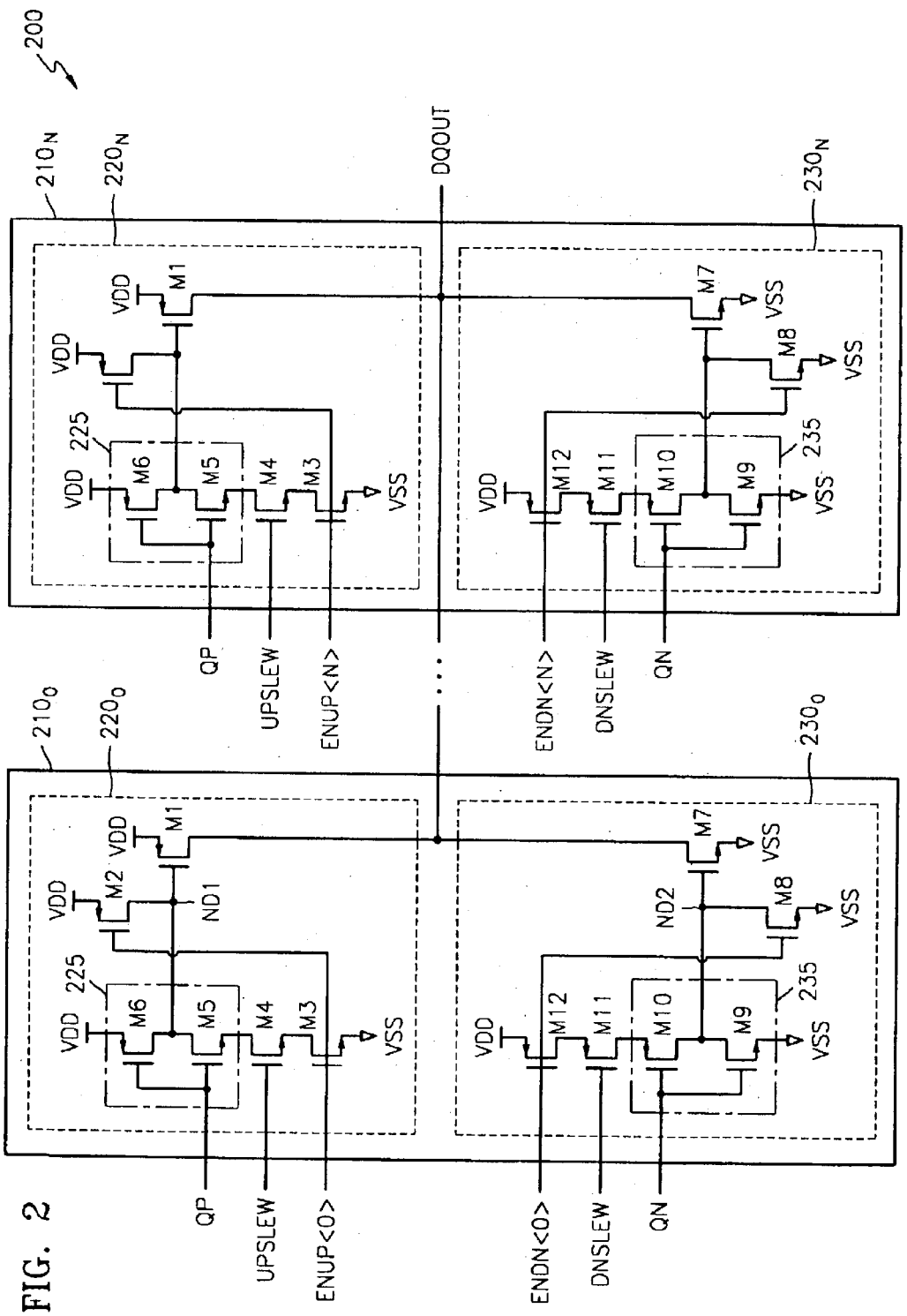
FIG. 2 is a circuit diagram illustrating a push-pull driver according to an embodiment of the present invention.

FIG. 2 is a detailed circuit diagram of the push-pull driver 200 of FIG. 1. Referring to FIG. 2, the push-pull driver 200 includes (N+1) push-pull driving circuits $210_0 \ldots 210_N$. Only the first push-pull driving circuit $210_0$ will now be described because each of the (N+1) push-pull driving circuits $210_0 \ldots 210_N$ have the same structure.

The first push-pull driving circuit $210_0$ includes a pull-up unit $220_0$ and a pull-down unit $230_0$. The pull-up unit $210_0$ drives the voltage level of an output signal DQOUT toward the level of a power supply voltage VDD in response to the first data signal QP being at a logic level high H, under the control of an up-slew rate control signal UPSLEW and the first bit ENUP<0> of the up-driving strength control signal ENUP<0:N>.

To be more specific, the pull-up unit $220_0$ includes a pull-up transistor M1 a first data receiving circuit 225, an up-slew rate control transistor M4 and a pull-up unit control transistor M3.

The first data receiving circuit 225 receives the first data signal QP and outputs a pull-up driving signal. Preferably, the first data receiving circuit 225 is composed of a PMOS transistor M6 and an NMOS transistor M5. In the first data receiving circuit 225, the PMOS transistor M6 is configured so that its source is connected to the power supply voltage VDD, its drain is connected to a first node ND1, and its gate receives the first data signal QP. The NMOS transistor M5 is configured so that its source is ultimately connected to a ground voltage VSS, its drain is connected to the first node ND1, and its gate receives the first data signal QP. The pull-up driving signal corresponds to the voltage at the first node ND1.

The pull-up transistor M1 drives the voltage level of the output signal DQOUT toward the level of the first output voltage, that is, the power supply voltage VDD, in response to the pull-up driving signal (the voltage level at the first node ND1). Preferably, the pull-up transistor M1 is a PMOS transistor configured so that its gate is coupled to a first node ND1, its source is coupled to a power supply voltage VDD, and its drain is coupled to the port of an output signal DQOUT.

The up-slew rate control transistor M4 controls the up-slew rate of the output signal DQOUT by regulating the rate at which the voltage level of the output signal DQOUT can rise to the level of a power supply voltage (VDD) based on the up-slew rate control signal UPSLEW. Preferably, the up-slew rate control transistor M4 is an NMOS transistor configured so that its drain is coupled to the source of the NMOS transistor M5 of the first data receiving circuit 225, and its gate receives the up-slew rate control signal UPSLEW.

As the voltage level of the up-slew rate control signal UPSLEW increases, the turn-on resistance of the up-slew rate control transistor M4 decreases, thereby causing the voltage of the first node ND1 to fall more quickly down to the level of the ground voltage VSS when the first data signal QP changes from logic low L to logic high H. As the voltage level of the first node ND1 falls more quickly, the pull-up transistor M1 more quickly drives the voltage level of the output signal DQOUT toward the level of the power supply voltage VDD, thereby increasing the up-slew rate.

On the other hand, as the voltage level of the up-slew rate control signal UPSLEW decreases, the turn-on resistance of the up-slew rate control transistor M4 increases. The increased turn-on resistance of the up-slew rate control transistor M4 causes the voltage of the first node ND1 to fall down to the level of the ground voltage VSS more slowly when the first data signal QP changes from logic low L to logic high H. Accordingly, the pull-up transistor M1 drives the voltage level of the output signal DQOUT more slowly toward the level of the power supply voltage VDD, thereby decreasing the up-slew rate.

As described above, the up-slew rate of the output signal DQOUT is controlled by controlling the voltage level of the up-slew rate control signal UPSLEW. Regardless of the desired up-slew rate, the up-slew rate control signal UPSLEW should have a voltage level high enough to turn on the up-slew rate control transistor M4.

In the pull-up unit $220_0$, the pull-up unit control transistor M3 enables or disables the pull-up transistor M1 in response to the first bit ENUP<0> of the up-driving strength control signal ENUP<0:N>. The bits of the up-driving strength control signal ENUP<0:N> are binary signals each having either a low logic level L or a high logic level H. Specifically, when bit ENUP<0> is at a high logic level H, the pull-up unit control transistor M3 enables the pull-up transistor M1, i.e., allows the pull-up transistor to be turned on when the first data signal QP is logic high H. When bit ENUP<0> is at a low logic level L, the pull-up unit control transistor M3 disables the pull-up transistor M1, i.e., prevents the pull-up transistor M1 from being turned on when the first data signal QP is logic high H.

Preferably, the pull-up unit control transistor M3 is an NMOS transistor configured so that its drain is coupled to the source of the up-slew rate control transistor M4, its source is coupled to the ground voltage VSS, and its gate receives the first bit ENUP<0> of the up-driving strength control signal ENUP<0:N>.

If the first bit ENUP<0> of the up-driving strength control signal ENUP<0:N> is logic low L, the pull-up unit control transistor M3 is turned off, and a path from the first node ND1 to the ground voltage VSS is blocked. Thus, the voltage of the first node ND1 (the pull-up driving signal) will be at a high logic level H, such that the pull-up transistor M1 will be turned off. Thus, the pull-up transistor M1 cannot help drive the voltage level of the output signal DQOUT toward the level of the power supply voltage VDD when the first data signal QP is at a high logic level H. That is, if the first bit ENUP<0> of the up-driving strength control signal ENUP<0:N> is logic low, the pull-up transistor M1 of the pull-up unit $220_0$ is disabled from contributing with the other pull-up units $220_1 \ldots 220_N$ to drive the voltage level of the output signal DQOUT to the level of a power supply voltage VDD. Therefore, the total up-driving strength of the push-pull driver 200 is reduced.

On the other hand, if the first bit ENUP<0> is at a high logic level H, the pull-up unit control transistor M3 is turned on. Thus, when the first data signal QP is logic high H, a clear path is provided from first node ND1 the ground voltage VSS, thereby causing the voltage level of the first node ND1 (the up-driving strength signal) to be at a low logic level L. The pull-up unit transistor M3 therefore enables the pull-up transistor M1 to be turned on and help drive the voltage level of the output signal DQOUT toward the level of the power supply voltage VDD. Accordingly, when the first bit ENUP<0> is at a high logic level H, the pull-up transistor M1 of pull-up unit $220_0$ can contribute with the other pull-up units $220_1 \ldots 220_N$ to drive the output signal DQOUT when the first data signal QP is logic high H, and the overall up-driving strength of the push-pull driver 200 is increased.

Preferably, the pull-up unit $220_0$ also includes a floating prevention transistor M2 for preventing the input node of the pull-up transistor M1 (first node ND1) from floating. It is also preferable that the floating prevention transistor M2 is a PMOS transistor configured so that its source is coupled to a power supply voltage VDD, its drain is coupled to the first node ND1, and its gate receives the first bit ENUP<0> of the up-driving strength control signal ENUP<0:N>.

The floating prevention transistor M2 of the pull-up unit $220_0$ is turned off when the first bit ENUP<0> of the up-driving strength control signal ENUP<0:N> is logic high H. When the first bit ENUP<0> of the up-driving strength control signal ENUP<0:N> is logic low L, the floating prevention transistor M2 is turned on, thereby rendering the voltage level of the first node ND1 at a high logic level H. Accordingly, the pull-up transistor M1 is firmly turned off when the first bit ENUP<0> of the up-driving strength control signal ENUP<0:N> is logic low L.

In the following description of the operation of the pull-up unit $220_0$, it is assumed that the up-slew rate control signal UPSLEW has a voltage level high enough to turn on the up-slew rate control transistor M4, and that the first bit ENUP<0> of the up-driving strength control signal ENUP<0:N> is in a high level H.

Under the above-described assumptions, when the first data signal QP is at a high level H, the NMOS transistor M5 of the first data receiving circuit 225 is turned on, while the PMOS transistor M6 is turned off. Accordingly, the voltage level of the first node ND1 (the pull-up driving signal) falls to a low level L via the path created by the NMOS transistor M5, the up-slew rate control transistor M4, and the pull-up unit control transistor M3 to the ground voltage VSS. Thus, the pull-up transistor M1 is turned on to drive the voltage level of the output signal DQOUT toward the level of the power supply voltage VDD. At this time, the rate at which the voltage of the first node ND1 becomes low, i.e., the rate at which the voltage level of the output signal DQOUT rises, is determined by the up-slew rate control signal UPSLEW.

On the other hand, when the first data signal QP is at a low level L, the PMOS transistor M6 of the first data receiving circuit 225 is turned on, while the NMOS transistor P5 is turned off. Therefore, the NMOS transistor P5 causes the voltage of the first node ND1 (the pull-up driving signal) to be at a high level H by blocking the path between the first node ND1 and the ground voltage VSS. Thus, the pull-up transistor M1 is quickly turned off.

Accordingly, the pull-up transistor M1 is turned on more slowly than it is turned off. The same theory is applied to the pull-down transistor M7, which will be described below. This helps prevents electric current from flowing through both the pull-up transistor M1 and the pull-down transistor M7.

The pull-down unit $230_0$ drives the voltage level of the output signal DQOUT toward the level of the ground voltage level VSS in response to the second data signal QN, under the control of a down-slew rate control signal DNSLEW and the first bit ENDN<0> of a down-driving strength control signal ENDN<0:N>. To be more specific, the pull-down unit $230_0$ includes a pull-down transistor M7, a second data receiving circuit 235, a down-slew rate control transistor M11 and a pull-down unit control transistor M12.

The second data receiving circuit 235 receives the second data signal QN and outputs a pull-down driving signal. Preferably, the second data receiving circuit 235 is composed of an NMOS transistor M9 and a PMOS transistor M10. In the second data receiving circuit 235, the NMOS transistor M9 is configured so that its source is coupled to a ground voltage VSS, its drain is coupled to a second node ND2, and its gate receives the second data signal QN. The PMOS transistor M10 is configure so that its source is finally coupled to a power supply voltage VDD, its drain is coupled to the second node ND2 and its gate receives the second data signal QN. Here, the pull-down driving signal corresponds to the voltage at the second node ND2.

The pull-down transistor M7 drives the voltage level of the output signal DQOUT toward the level of the second output voltage, that is, the ground voltage VSS, in response to the pull-down driving signal (the voltage level at the second node ND2). Preferably, the pull-down transistor M7 is an NMOS transistor configured so that its gate is coupled to the second node ND2, its source is coupled to the ground voltage VSS, and its drain is coupled to the port of the output signal DQOUT.

The down-slew rate control transistor M11 controls the down-slew rate at which the voltage level of the output signal DQOUT can fall down to the ground voltage level VSS, based on the down-slew rate control signal DNSLEW. Preferably, the down-slew rate control transistor M11 is a PMOS transistor configured so that its drain is coupled to the source of the PMOS transistor M10 of the second data receiving circuit 235, and its gate receives the down-slew rate control signal DNSLEW.

As the voltage level of the down-slew rate control signal DNSLEW decreases, the turn-on resistance of the down-slew rate control transistor M11 decreases, thereby causing the voltage of the second node ND2 to more quickly rise to the level of the power supply voltage VDD when the data state of the second data signal QN changes from logic high H to logic low L. As the voltage level of the second node ND2 rises more quickly, the pull-down transistor M7 more quickly drives the voltage level of the output signal DQOUT toward the ground voltage level VSS, thereby increasing the down-slew rate.

On the other hand, as the voltage level of the down-slew rate control signal DNSLEW increases, the turn-on resistance of the down-slew rate control transistor M11 increases. The increased turn-on resistance of the down-slew rate control transistor M11 causes the voltage of the second node ND2 to rise to the level of the power supply voltage VDD more slowly when the second data signal QN changes data state from logic high H to logic low L. Accordingly, the pull-down transistor M7 more slowly drives the voltage level of the output signal DQOUT toward the level of the ground voltage VSS, thereby decreasing the down-slew rate.

As described above, the down-slew rate of the output signal DQOUT is controlled by controlling the voltage level of the down-slew rate control signal DNSLEW. Regardless of the desired down-slew rate, the down-slew rate control signal DNSLEW should have a voltage level, which is high enough to turn on the down-slew rate control transistor M11.

In the pull-down unit $230_0$, the pull-down unit control transistor M12 enables or disables the pull-down transistor M7 in response to the first bit ENDN<0> of the down-driving strength control signal ENDN<0:N>. The bits of the down-driving strength control signal ENDN<0:N> are binary signals each having a low logic level L or a high logic level H. Specifically, when bit ENDN<0> is at a high logic level H, the pull-down unit control transistor M12 disables the pull-down transistor M7, i.e., prevents the pull-down transistor M7 from turning on when the second data signal QN being logic low L. When ENDN<0> is at a low logic level L, the pull-down unit control transistor M12 enables the pull-down transistor M7, i.e., allows the pull-down transistor to turn on when the second data signal QN being logic high H.

Preferably, the pull-down unit control transistor M12 is a PMOS transistor configured so that its drain is coupled to the source of the down-slew rate control transistor M11, its source is coupled to the power supply voltage VDD, and its gate receives the first bit ENDN<0> of the down-driving strength control signal ENDN<0:N>.

If the first bit ENDN<0> of the down-driving strength control signal ENDN<0:N> is logic high H, the pull-down unit control transistor M12 is turned off, and a path from the second node ND2 to the power supply voltage VDD is blocked. Thus, the voltage of the second node ND2 (the pull-down driving signal) will be a low logic level L, such that the pull-down transistor M7 will be turned off even when the second data signal is logic low L. Thus, the pull-down transistor M7 cannot help drive the voltage level of the output signal DQOUT toward the level of the ground voltage VSS when the second data signal QN is logic low L. That is, if the first bit ENDN<0> of the down-driving strength control signal ENDN<0:N> is logic high H, the pull-down transistor M7 of the pull-down unit $230_0$ is disabled from contributing with the other pull-down units $230_1 \ldots 230_N$ to drive the voltage level of the output signal DQOUT to the ground voltage level VSS, regardless of the data state of the second data signal QN. Therefore, the total down-driving strength of the push-pull driver 200 is reduced.

On the other hand, if the first bit ENDN<0> is at a low logic level L, the pull-down unit control transistor M12 is turned on. Therefore, a clear path is provided from the second node ND1 to the power supply voltage VDD when the second data signal QN is logic low L. Thus, the pull-down transistor M7 is enabled by the pull-down unit control transistor M12 to be turned on and help drive the voltage level of the output signal DQOUT to the ground voltage level VSS. Accordingly, when the first bit ENDN<0> is at a low logic level L, the pull-up transistor M7 of the pull-up unit $230_0$ contributes with the other pull-down units $230_1 \ldots 230_N$ to drive the output signal DQOUT when the second data signal QN is logic low L. The overall down-driving strength of the push-pull driver 200 is thereby increased.

Preferably, the pull-down unit $230_0$ also includes a floating prevention transistor M8 for preventing the input node of the pull-down transistor M7 (second node ND2) from floating. It is also preferable that the floating prevention transistor M8 is an NMOS transistor configured so that its source is coupled to a ground voltage VSS, its drain is coupled to the second node ND2, and its gate receives the first bit ENDN<0> of the down-driving strength control signal ENDN<0:N>.

The floating prevention transistor M8 of the pull-down unit $230_0$ is turned off when the first bit ENDN<0> of the down-driving strength control signal ENDN<0:N> is at a logic low level. When the first bit ENUP<0> of the down-driving strength control signal ENDN<0:N> is at a high logic level H, the floating prevention transistor M8 is turned on to change the voltage level of the second node ND2 into a logic low L. Accordingly, the pull-down transistor M7 is firmly turned off when the first bit ENDN<0> of the down-driving strength control signal ENDN<0:N> is at a high logic level H.

In the following description of the operation of the pull-down unit $230_0$, it is assumed that the down-slew rate control signal DNSLEW has a voltage level low enough to turn on the down-slew rate control transistor M11, and that the first bit ENDN<0> of the down-driving strength control signal ENDN<0:N> is a logic low L.

Under the above-described assumptions, when the second data signal QN is at low logic level L, the PMOS transistor M10 of the second data receiving circuit 235 is turned on, while the NMOS transistor M9 is tuned off. Accordingly, the voltage of the second node ND2 (the pull-down driving signal) is rendered high by the path to the power supply voltage VDD created by the PMOS transistor M10, the down-slew rate control transistor M1, and the pull-down unit control transistor M12. Thus, the pull-down transistor M7 is turned on to drive the voltage level of the output signal DQOUT toward the ground voltage VSS. Here, the rate at which the voltage of the second node ND2 rises, i.e., the rate at which the voltage level of the output signal DQOUT falls, is determined by the down-slew rate control signal DNSLEW.

On the other hand, when the second data signal QN is at a high level H, the NMOS transistor M9 of the second data receiving circuit 235 is turned off. Thus, the NMOS transistor M9 causes the voltage of the second node ND2 to be at a low logic level L by blocking the path between the second node ND2 and the power supply voltage VDD. Thus, the pull-down transistor M7 is quickly turned off.

Although only the structure and operation of the first push-pull driving circuit $210_0$ are described above in detail, the same description also applies to the structure and operation of the other push-pull driving circuits $210_1 \ldots 210_N$ in the push-pull driver 200.

The up-slew rate control signal UPSLEW received by the first pull-up unit $220_0$ is the same as the up-slew rate control signal UPSLEW received by each of the pull-up units $220_1 \ldots 220_N$ of the push-pull driver 200. Likewise, the down-slew rate control signal DNSLEW received by first pull-down unit $230_0$ is the same as the down-slew rate control signal DNSLEW received by each of the pull-down units $230_1 \ldots 230_N$ of the push-pull driver 200.

However, each of the push-pull driving circuits $210_0 \ldots 210_N$ is controlled by its respective bits in the up-driving strength control signal ENUP<0:N> and the down-driving strength control signal ENDN<0:N>. In other words, the pull-up strength of the $(n+1)^{th}$ push-pull driving circuit $210_n$ (where n is an integer ranging from 0 to N) is determined by the $n^{th}$ bit ENUP<n> of the up-driving control signal ENUP<0:N>, while the pull-down strength of the $(n+1)^{th}$ push-pull circuit $210_n$ is determined by the $n^{th}$ bit ENDN<n> of the down-driving control signal ENDN<0:N>.

Consequently, the voltage level of the output signal DQOUT is driven toward the power supply voltage VDD collectively by all of the enabled pull-up units $220_0 \ldots 220_N$ of the (N+1) push-pull driving circuits $210_0 \ldots 210_N$.

Accordingly, the pull-up units $220_0 \ldots 220_N$ may collectively be referred to as a pull-up driving circuit. The voltage level of the output signal DQOUT is also driven toward the ground voltage VSS collectively by all of the enabled pull-down units $230_0 \ldots 230_N$ of the first through (N+1) push-pull driving circuits $210_0 \ldots 210_N$. Therefore, the pull-down units $230_0 \ldots 230_N$ can collectively be referred to as a pull-down driving circuit.

The up-slew rate and the down-slew rate can be independently controlled by generating an up-slew rate control signal UPSLEW and a separate down-slew rate control signal DNSLEW. Accordingly, the UPSLEW and DNSLEW signals may have different voltage levels. Also, the pull-up strength can also be controlled independently of the pull-down strength by generating a separate up-driving strength control signal ENUP<0:N> and down-strength control signal ENDN<0:N>, each having a different set of bit signals.

According to an exemplary embodiment, the pull-up driving strength and the pull-down driving strength of the push-pull driver 200 can be effectively adjusted by differentiating the size of the pull-up transistor M1 and pull-down transistor M7 in each of the (N+1) push-pull driving circuits $210_0 \ldots 210_N$. For example, the pull-up transistors M1 and the pull-down transistors M7 can be implemented with a binary-weighted size. In such an implementation, the size of the pull-up transistor M1 and pull-down transistor M7 in the $n^{th}$ push-pull circuit $210_n$ (which receives the bits ENUP<n> and ENDN<n> of the up-driving strength control signal ENUP<0:N> and the down-driving strength control signal ENDN<0:N>, respectively; n being an integer ranging from 0 . . . N) are each a factor of $2^n$ times larger than the respective sizes of the pull-up transistor M1 and pull-down transistor M7 of the first push-pull circuit $210_0$. An example of implementing transistors implemented with binary weighted sizes is provided in the next paragraph.

If both the pull-up transistor M1 and the pull-down transistor M7 of the first push-pull driving circuit $210_0$ have a size S, the pull-up transistor M1 and pull-down transistor M7 of the second push-pull driving circuit $210_1$ will have a size of $2^1*S$, the pull-up transistor M1 and pull-down transistor M7 of the third push-pull driving circuit $210_2$ will have a size of $2^2*S$, . . . , etc., such that the pull-up transistor M1 and pull-down transistor M7 of the $(n+1)^{th}$ push-pull driving circuit $210_n$ have a size of $2^n*S$.

If the pull-up transistors M1 and pull-down transistors M7 of the (N+1) push-pull driving circuits $210_0 \ldots 210_N$ have binary weighted sizes as described above, the effective width of the total number of enabled (i.e., turned-on) pull-up transistors M1 can be determined according to the overall pull-up driving strength value, whose binary value is formed by the combination of bits ENUP<0> . . . ENUP<N> in the up-driving strength control signal ENUP<0:N>. Similarly, the effective width of the total number of enabled pull-down transistors M7 in the push-pull driver 200 can be determined according to the overall pull-down driving strength value, whose binary value is formed by the combination of bits ENDN<0> . . . ENDN<N> in the down-driving strength control signal ENDN<0:N>.

Specifically, the effective width of the set of pull-up transistors M1 in the push-pull driver 200 can be determined by multiplying the width of the pull-up transistor M1 in the first pull-up unit $220_0$ by the overall pull-up driving strength value. Similarly, the effective width of the set of pull-up transistors M7 can be determined by multiplying the width of the pull-down transistor M7 in the first pull-up unit $220_0$ by the overall pull-down driving strength value.

The effective on-resistance of the set of pull-up transistors M1 corresponds to the aggregate resistance of all of the enabled pull-up transistors M1. Further, the effective on-resistance of the set of pull-down transistors M7 corresponds to the aggregate resistance of all of the enabled pull-down transistors M7. As the effective width of the set of pull-up transistors M1 and the set of pull-down transistors M7 increase, the effective on-resistance of each decreases, leading to an increased pull-up driving strength and pull-down driving strength, respectively.

Thus, by forming the pull-up transistors M1 and the pull-down transistors M7 of the push-pull driver 200 with binary weighted sizes, the pull-up and pull-down driving strengths of the push-pull driver 200 may be controlled to be integral multiple of the pull-up driving strength of the first pull-up unit $220_0$ and the pull-down driving strength of the first pull-down driver $230_0$, respectively.

For example, if N is 2 (i.e., the number of push-pull driving circuits $210_0 \ldots 210_N$ is three), then the pull-up driving strength of the push-pull driver 200 can be controlled as follows. When the overall pull-up driving strength value is to be set to a decimal value of 1 (i.e., set to be equal to the pull-up driving strength of the first pull-up unit $220_0$), the up-driving strength control signal bits ENUP<0>, ENUP<1>, and ENUP<2> are set to 1, 0, and 0, respectively (thereby forming a binary value of 001). Accordingly, when the up-driving strength control signal bits ENUP<0>, EN<1>, and ENUP<2> are set to 1, 1, and 0, respectively (corresponding to a binary value of 011, or a decimal value of 3), the pull-up driving strength is set to be a factor of 3 times greater than the pull-up driving strength of the first pull-up unit $220_0$. Similarly, when bits EN<0> . . . ENUP<2> represent binary values of 010, 100, 101, 110, and 111, respectively, the up-driving strength of the push-pull driver 200 is set to be a factor of 2, 4, 5, 6 and 7, times greater than the pull-up driving strength of the first pull-up unit $220_0$, respectively.

According to an exemplary embodiment, when there is no data to be output, the push-pull driver 200 enters into a tri-state. In this embodiment, the pre-driver 100 may control the push-pull driver 200 to enter the tri-state by setting the first data signal QP at a logic low L and the second data signal QN at a logic high. Accordingly, when the push-pull driver 200 is in the tri-state, neither the set of pull-up units $220_0 \ldots 220_N$, nor the set pull-down units $230_0 \ldots 230_N$ will be turned on in response to the first and second data signals QP and QN, and the output signal DQOUT will not be driven by the push-pull driver 200 towards either the first voltage or the second voltage.

Thus, when the push-pull driver 200 is in the tri-state, the voltage level of the output signal DQOUT is sufficiently lower than logic level high H, and sufficiently higher than the logic level low L, thereby indicating a "no data" state for the semiconductor device. Accordingly, when the semiconductor device is not outputting data, the voltage level of the output signal DQOUT will not affect the output data of other chips connected to the same data bus as the semiconductor device.

The point of time at which the push-pull driver 200 either enters into, or departs from, the tri-state should be synchronized with the point of time at which the semiconductor device generates the output data. If the transition of the push-pull driver 200 out of the tri-state is not properly synchronized, the push-pull driver 200 may exit out of the tri-state before the output data is prepared by the semiconductor device, causing erroneous data to be output.

Alternatively, if the push-pull driver's 200 departure from the tri-state occurs too late, the semiconductor device might output its data after the point of time at which the data is expected.

Figure 3:
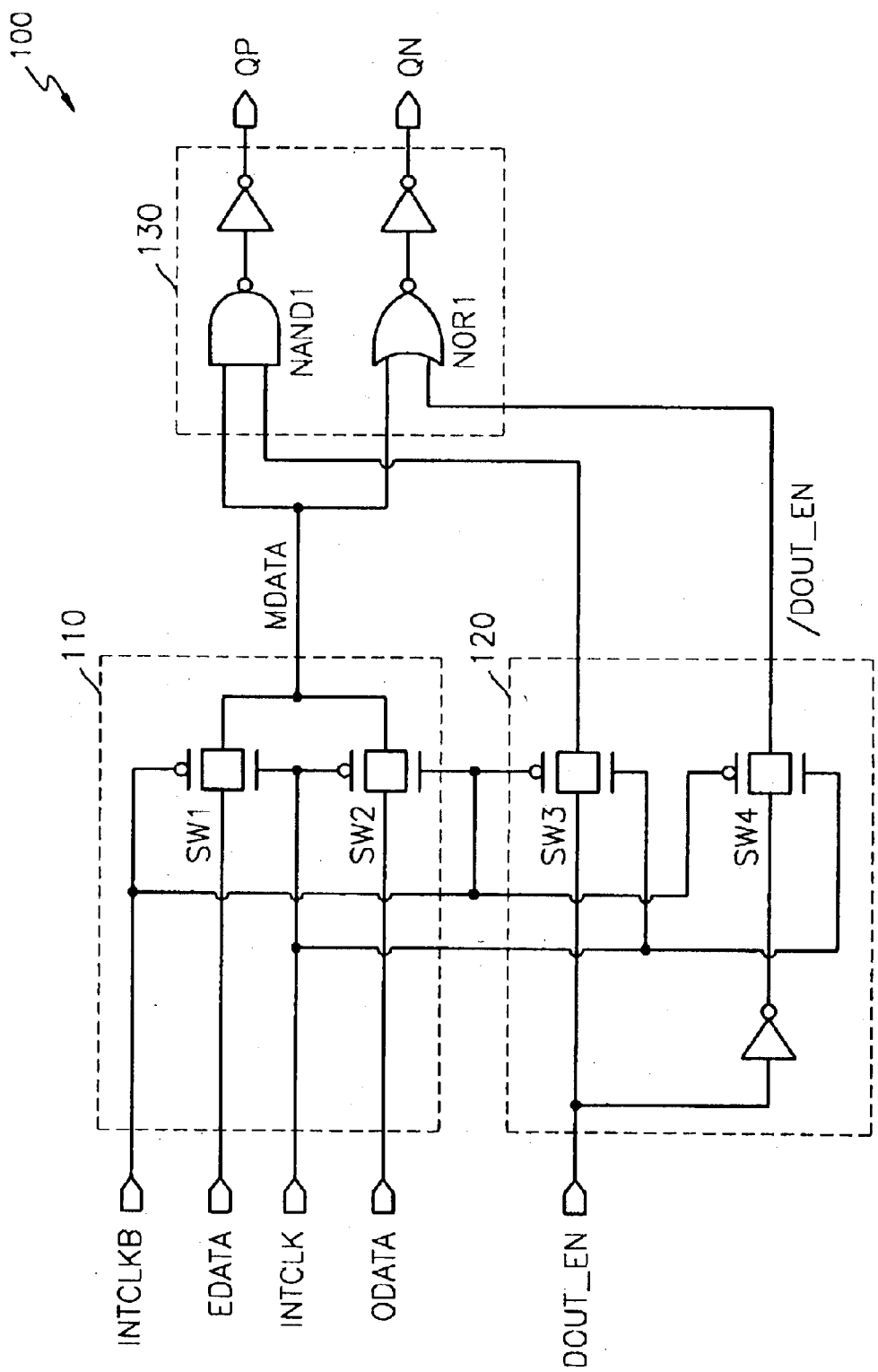
FIG. 3 is a circuit diagram illustrating a pre-driver according to an embodiment of the present invention.

FIG. 3 illustrates a detailed circuit diagram of a pre-driver 100 for controlling the tri-state of the push-pull driver 200. Referring to FIG. 3, the pre-driver 100 includes a data latch unit 110, an active signal latch unit 120 and a logic unit 130.

The data latch unit 110 receives the internal data signals EDATA and ODATA as inputs, and outputs a multiplexed data signal MDATA. The data latch unit 110 includes first and second switches SW1 and SW2, the first switch SW1 receiving the internal data signal EDATA, and the second switch SW2 receiving the internal data ODATA. When the first switch SW1 is turned on, it latches the internal data signal EDATA, and sends the latched EDATA signal to the output of the data latch unit 110. When the second switch is turned on, it latches the internal data signal ODATA, and sends the latched EDATA signal to the output of the data latch unit 110.

The first switch SW1 is turned on, and the second switch SW2 is turned off, when an internal clock signal INTCLK is in a first state (e.g., logic level high H). The second switch SW2 is turned on, and the first switch SW1 is turned off, when the internal clock signal INTCLK is in a second state (e.g., logic level low L), to latch the internal data signal ODATA as the signal to be output as the multiplexed data signal MDATA.

Each time the internal clock signal INTCLK changes state, the data latch unit 110 latches an alternate one of the internal data signals EDATA and ODATA as the new data value for the multiplexed data signal MDATA. Therefore, each data period of the multiplexed data signal MDATA is half of a clock cycle (i.e., until INTCLK changes state). Accordingly, the multiplexed data signal MDATA has a data rate, which is double the data rate of either internal data signal EDATA and ODATA.

The active signal latch unit 120 latches a received output data enable signal DOUT_EN, and outputs the latched output data enable signal DOUT_EN, as well as a latched inverted output data enable signal /DOUT_EN to the logic unit 130. The active latch unit 120 includes an inverter, which inverts the received output enable signal DOUT_EN to generate the inverted output data enable signal /DOUT_EN. The active latch unit 120 also includes third and fourth switches SW3 and SW4.

The third switch SW3 is turned on when the internal clock signal INTCLK is in a logic high state H, and latches the received output enable signal DOUT_EN. The fourth switch SW4 is turned on when the internal clock signal INTCLK is in a logic high state H, and latches the inverted output enable signal /DOUT_EN.

The logic unit 130 includes a "NAND" logic gate NAND1 and a "NOR" logic gate NOR1, each of which has an inverting unit connected to its output. The logic unit 130 performs an inverted "NAND" logic operation on the multiplexed data signal MDATA and the latched output enable signal DOUT_EN using the logic gate NAND1 and the corresponding inverting unit. Further, the logic unit 130 performs an inverted "NOR" logic operation on the multiplexed data signal MDATA and the latched inverted output enable signal /DOUT_EN using the logic gate NOR1 and the corresponding inverting unit.

Accordingly, the operation of the logic unit 130 is as follows. The logic unit 130 outputs the multiplexed data signal MDATA as the first and second data signals QP and QN when the output enable signal DOUT_EN is latched by the active signal latch unit 120 in a first state (i.e., logic level high H). When the output enable signal DOUT_EN is latched in a second state (i.e., logic level low L), the logic unit 130 outputs the first data QP with a logic low level and outputs the second data QN with a logic high level.

Accordingly, the pull-up transistors M1 and pull-down transistors M7 of the push-pull driver 200 are all turned off while the output enable signal DOUT_EN is at a low logic level L. Once the output enable signal DOUT_EN is at a high logic level H, the push-pull driver 200 can drive the output signal DQOUT to either the first or second voltage, based on the logic level of the first and second data signals QP and QN.

As described above, the point of time at which the push-pull driver 200 enters or exits the tri-state can be precisely synchronized with the point of time at which data is output, by latching the output enable signal DOUT_EN based on the internal clock signal INTCLK.

Figure 4:
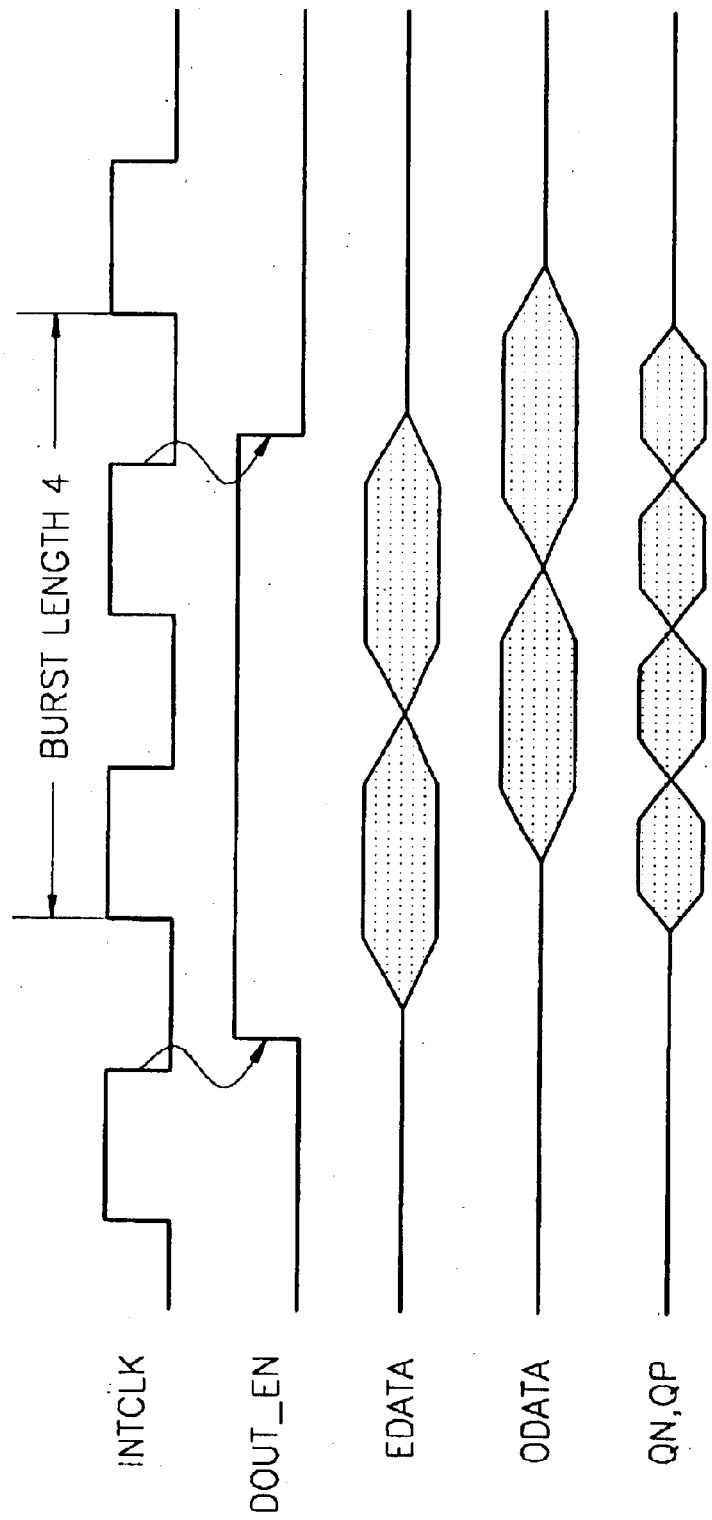
FIG. 4 is a timing diagram illustrating the operation of a pre-driver.

FIG. 4 is an operation timing diagram of the pre-driver 100 of FIG. 3. FIG. 4 illustrates a situation where a data burst length is 4, i.e., where data values are output during four consecutive data cycles. The output enable signal DOUT_EN is generated about ½ of a clock cycle earlier than the time at which the first and second data signals QP and QN as shown in FIG. 4, are actually output from the pre-driver 100 to the push-pull driver 200, because the output enable signal DOUT_EN is latched at the rising edge of the internal clock signal INTCLK.

For a data burst length of 4, the DOUT_EN is active (at a high logic level H) for two cycles of internal clock signal INTCLK. During this period, as described above referring to FIG. 3, when the internal clock signal INTCLK is at a high logic level H, the data state of the first and second data signals QP and QN represent the data state of the internal data signal EDATA. Consequently, the output signal DQOUT (not shown in FIG. 4) has the same data state as the internal data signal EDATA. When the internal clock signal INTCLK is at a low logic level L, the first and second data signals QP and QN, represent the data date of the internal data signal ODATA. Therefore, the output signal DQOUT has the same data state as the internal data signal ODATA. Here, each of the internal data signals EDATA and ODATA have half the data rate of the output data signal DQOUT.

Figure 5:
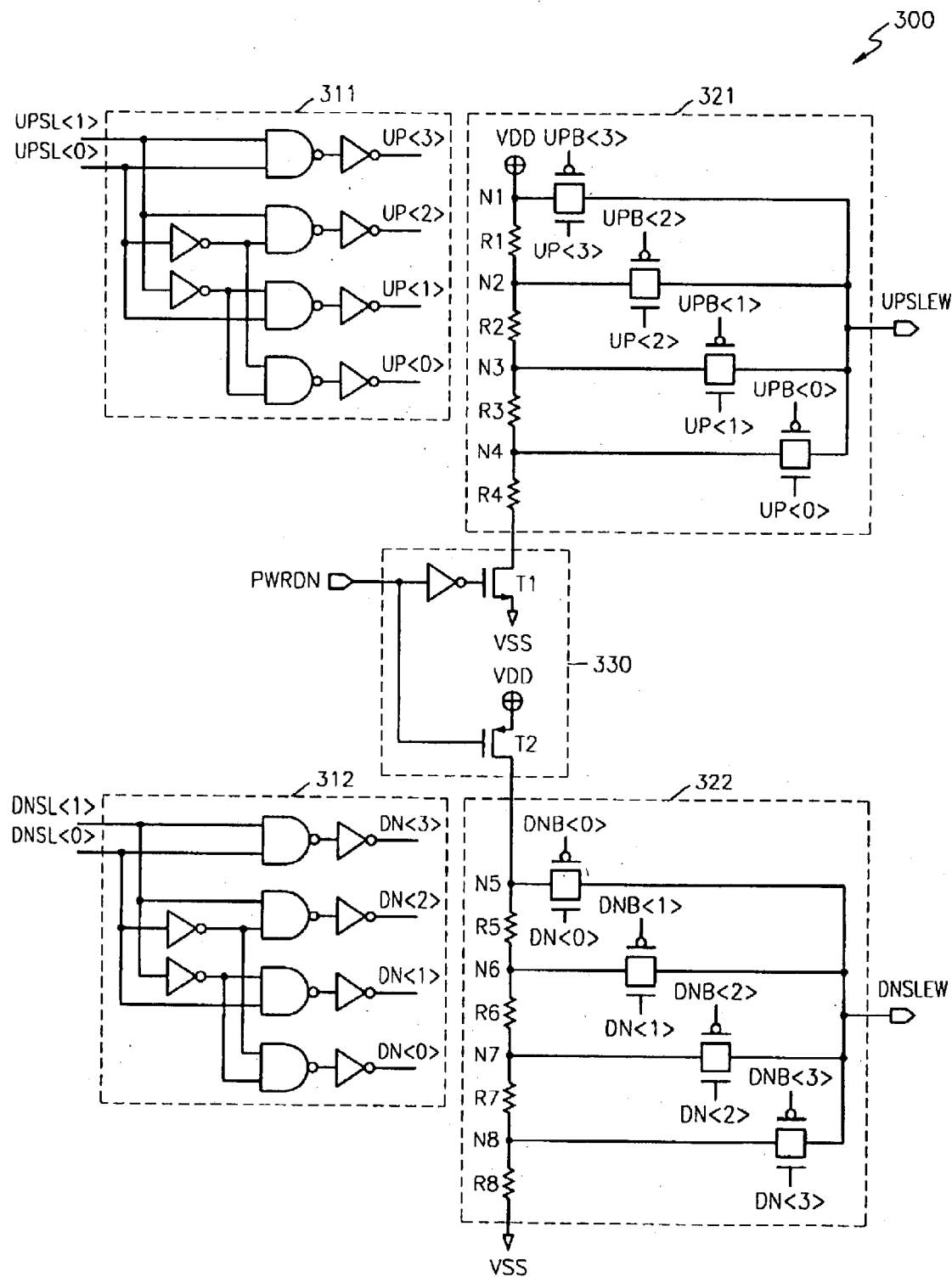
FIG. 5 is a circuit diagram illustrating a circuit for generating an up-slew rate control signal and a down-slew rate control signal according to an embodiment of the present invention.

FIG. 5 illustrates an exemplary digital-analog converter 300 for generating an up-slew rate control signal UPSLEW and a down-slew rate control signal DNSLEW, in the push-pull driver 200. As shown in FIG. 1, a two-bit binary up-slew control code UPSL<0:1> and a two bit binary down-slew rate control code DNSL<0:1> are input to the push-pull driver 200. The digital-analog converter 300 converts the two-bit binary up-slew rate control code UPSL<0:1> into an analog up-slew rate control signal UPSLEW, and converts the two-bit binary down-slew rate control code DNSL<0:1> into an analog down-slew rate control signal DNSLEW.

Referring to FIG. 5, the digital-analog converter 300 includes first and second decoders 311 and 312, an up-slew rate control signal generator 321, a down-slew rate control signal generator 322 and a controller 330. The first decoder 311 decodes the two-bit binary up-slew rate control code UPSL<0:1> to output four binary decoding signals UP<0> ... UP<3>. That is, the first decoder 311 renders the voltage level of the first decoding signal UP<0> logic high H when the two-bit binary up-slew rate control code UPSL<0:1> is a binary value 00, renders the voltage level of the second decoding signal UP<1> logic high H when the two-bit binary up-slew rate control code UPSL<0:1> is a binary value 01, renders the voltage level of the third decoding signal UP<2> logic high when the two-bit binary up-slew rate control code UPSL<0:1> is binary value 10, and renders the voltage level of the fourth decoding signal UP<3> logic high when the two-bit up-slew rate control code UPSL<0:1> is binary value 11.

The second decoder 312 outputs the binary decoding signals DN<0> . . . DN<3> by decoding the two-bit binary down-slew rate control code DNSL<0:1> in the same way that the first decoder 311 decodes the two-bit binary up-slew rate control code UPSL<0:1>, as described in the preceding paragraph.

The up-slew rate control signal generation unit 321 produces four different voltage levels from a power supply voltage level VDD using the four resistors R1 . . . R4 and outputs an up-slew rate control signal UPSLEW having one selected from the four voltage levels in response to the decoding signals UP<0> . . . UP<3>. To be more specific, the up-slew rate control signal generation unit 321 adopts the voltage level of node N1 as the voltage level of the up-slew rate control signal UPSLEW when the first decoding signal UP<0> is at a high logic level H and adopts the voltage level of node N2 as the voltage level of the up-slew rate control signal UPSLEW when the second decoding signal UP<1> is at a high logic level H, adopts the voltage level of node N3 as the voltage level of the up-slew rate control signal UPSLEW when the third decoding signal UP<2> is at a high logic level H, and adopts the voltage level of node N4 as the voltage level of the up-slew rate control signal UPSLEW when the fourth decoding signal UP<3> is at a logic high level.

The down-slew rate control signal generation unit 322 produces four different voltage levels for nodes N5 . . . N8 using resistors R5 through R8. The down-slew rate control signal generation unit 321 outputs a down-slew rate control signal DNSLEW having the voltage level corresponding to one of the nodes N5 . . . N8, which is selected in response to the decoding signals DN<0> . . . DN<3>, in the same way that the up-slew rate control signal generation unit outputs the up-slew rate control signal UPSLEW, as described in the preceding paragraph.

The controller 330 receives a power-down control signal PWRDN, and includes NMOS transistor T1 and PMOS transistor T2. The power-down control signal PWRDN can be used to disable the up-slew rate control signal generation unit 321 and the down-slew rate control signal generation unit 322 to output voltage level from generating the voltage levels for the up-slew rate control signal UPSLEW and the down-slew rate control signal DNSLEW, respectively. Specifically, when the power-down control signal PWRDN is logic low L, the NMOS transistor T1 and the PMOS transistor T2 are turned on. While in the on state, the NMOS transistor T1 provides a clear path between the voltage source VDD and the ground voltage VSS via resistors R1 . . . R4, thereby producing the corresponding voltage levels at each of the nodes N1 . . . N4. When transistor T2 is in the on state, it provides a clear path between the voltage source VDD and the ground voltage VSS via resistors R5 . . . R8, thereby producing the corresponding voltage levels to each of the nodes N5 . . . N8.

However, when the power-down control signal PWRDN is logic high H, the NMOS transistor T1 and the PMOS transistor T2 are turned off. Accordingly, NMOS transistor T1 blocks the path between the voltage source VDD and the ground voltage VSS via resistors R1 . . . R4, thereby causing the voltage levels at nodes N1 . . . N4 to fall to zero. Also, the path between the power supply voltage VDD and the ground voltage VSS via resistors R5 . . . R8 is blocked thereby causing the voltage levels at nodes N5 . . . N8 to fall to zero, when PMOS transistor 72 is turned off.

Therefore, when the power-down control signal PWRDN is set to logic high H, the voltage levels generated by the up-slew rate control signal generation unit 321 and the down-slew rate control signal generation unit 322 are zero, regardless of the values of the two-bit binary up-slew rate control code UPSL<0:1> and the two-bit binary down-slew rate control code DNSL<0:1>.

The digital-analog converter of FIG. 5 is merely illustrative of a type of circuit for receiving and converting a digital code into an analog signal having several different types of voltage levels, and in no way limits the present invention. For example, the number of bits in the up-slew rate and down-slew rate digital codes is not limited to two bits, and correspondingly, the number of different voltage levels of the analog up-slew rate control signal UPSLEW and down-slew rate control signal DNSLEW is not limited to four voltage levels. Furthermore, the up-slew rate control signal UPSLEW and the down-slew rate control signal DNSLEW can be generated by different types of circuits from the circuit shown in FIG. 5.

Figure 6:
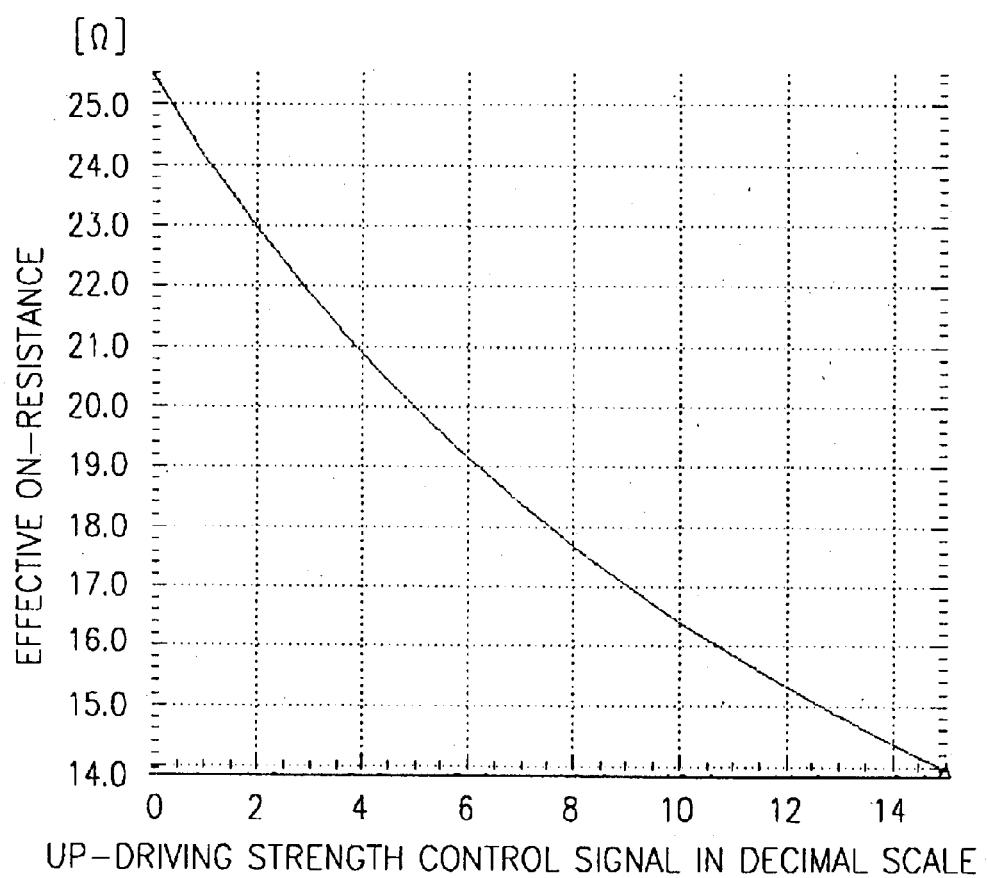
FIG. 6 illustrates a relationship between an up-driving strength control signal and the effective on-resistance of the pull-up transistors in a push-pull driver.

FIG. 6 illustrates an exemplary relationship between the up-driving strength control signal ENUP<0:N> and the effective on-resistance of the set of pull-up transistors M1 in the push-pull driver 200 of FIG. 2. As shown in FIG. 6, the effective on-resistance of the set of pull-up transistors M1 decreases as the decimal scale value formed by the combination of bits ENUP<0> . . . ENUP<N> of the up-driving strength control signal ENUP<0:N> increases. In other words, as the overall pull-up driving strength value represented by the up-driving strength control signal ENUP<0:N> increases from decimal values of 0 to 15, the aggregate on-resistance corresponding to all of the enabled pull-up transistors M1 decreases. The decrease in effective on-resistance causes the up-driving strength of the push-pull driver 200 to increase, thereby allowing the voltage level of the output signal DQOUT to be driven closer to the power supply voltage VDD by the set of pull-up units $220_0$–$220_N$ when the data state of DQOUT is logic high H.

Figure 7:
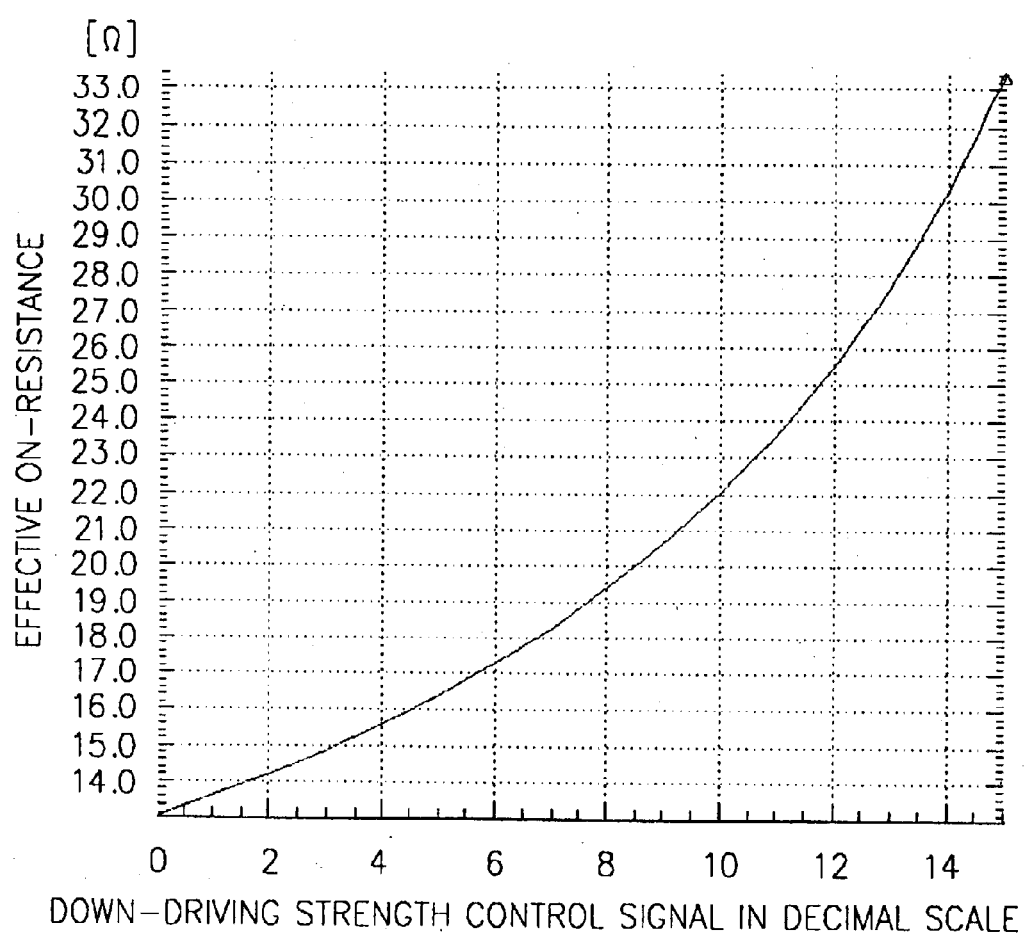
FIG. 7 illustrates a relationship between a down-driving strength control signal and the effective on-resistance of the pull-down transistors in a push-pull driver.

FIG. 7 illustrates an exemplary relationship between the down-driving strength control signal ENDN<0:N> and the effective on-resistance of the set of pull-down transistors M7 of the push-pull driver 200 of FIG. 2. The effective on-resistance of the set of pull-down transistor M7 decreases according to the decimal scale value formed by the combination of bits ENDN<0> . . . ENDN<N> of the down-driving strength control signal ENDN<0:N> increases. In other words, as the overall pull-down driving strength value represented by the down-driving strength control signal ENDN<0:N> decreases from 15 to 0, the aggregate on-resistance corresponding to all of the enabled pull-down transistors M7 decreases. This decrease in effective on-resistance causes the down-driving strength of the push-pull driver 200 to increase, thereby allowing the voltage level of the output signal DQOUT to be driven closer to the ground voltage VSS by the set of pull-down units $230_0$–$230_N$ when the data state of the output signal DQOUT is logic low L.

Figure 8:
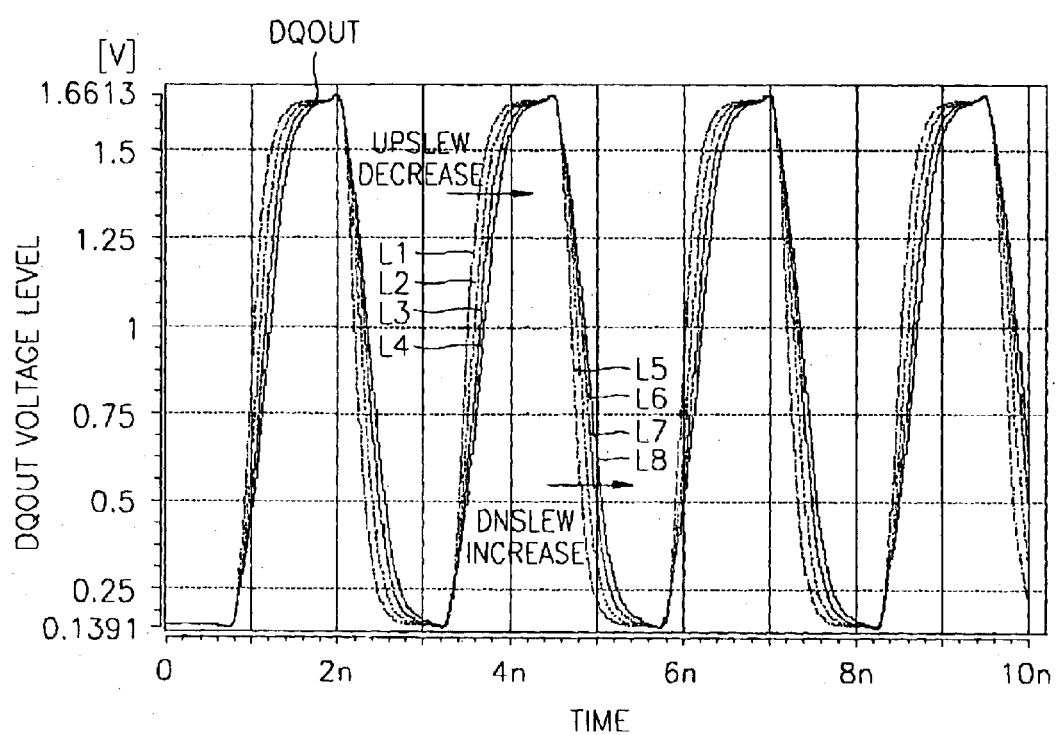
FIG. 8 illustrates the effect of adjusting the up-slew rate and down-slew rate control signals on the waveform of the output signal generated by a push-pull driver.

FIG. 8 includes a graph illustrative of how the waveform of the output signal DQOUT is affected when the voltage levels of up-slew rate control signal UPSLEW and the down-slew rate control signal DNSLEW are adjusted. As described above with respect to FIG. 2, as the voltage level of the up-slew rate control signal UPSLEW decreases, the amount of time needed for the output signal DQOUT rises from logic low L to logic high increases. Thus, the up-slew rate of output signal DQOUT decreases. Accordingly, the waveform of the output signal DQOUT has a less steep rising slope.

On the other hand, as the voltage level of the down-slew rate control signal DNSLEW increases, the amount of time required for the output signal DQOUT to fall from logic high H to logic low L increases, i.e., the down-slew rate decreases. Accordingly, the waveform of the output signal DQOUT has a less steep falling slope.

In FIG. 8, it is assumed that the up-slew rate control signal UPSLEW and the down-slew rate control signal DNSLEW are generated by converting the two-bit binary up-slew rate control code UPSL<0:1> and two-bit binary down-slew rate control code DNSL<0:1> of FIG. 5, respectively. Accordingly, the up-slew rate and down-slew rate of the push-pull driver 200 can be controlled by changing the two-bit binary up-slew rate control code UPSL<0:1> and the two-bit binary down-slew rate control code DNSL<0:1>.

When the binary up-slew rate control code UPSL<0:1> is a binary value 11 (decimal value 3), the rising slope of the waveform of the output signal DQOUT corresponds to L1. When the binary up-slew rate control code UPSL<0:1> is a binary value 10 (decimal value 2), the waveform has a rising slope of L2. When the binary up-slew rate control code UPSL<0:1> a binary value 01 (decimal value 1), the waveform has a rising slope of L3. When the binary up-slew rate control code UPSL<0:1> is a binary value 00 (decimal value 0), the waveform as a rising slope of L4.

Meanwhile, when the binary down-slew rate control code DNSL<0:1> is binary 11 (decimal 3), the waveform of the output signal DQOUT has a falling slope of L5. When the binary down-slew rate control code DNSL<0:1> is binary 10 (decimal 2), the waveform has a falling slope of L6. When the binary down-slew rate control code DNSL<0:1> is binary 01 (decimal 1), the waveform has a falling slope of L7. When the binary down-slew rate control code DNSL<0:1> is binary 00 (decimal 0), the waveform has a falling slope of L8.

While this invention has been particularly shown and described with reference to the exemplary embodiments described above, it will be understood by those skilled in the art that these embodiments do not limit the present invention, and that various changes in form and details may be made without departing from the spirit and scope of the invention as defined by the appended claims.

What is claimed is:

1. An output driver circuit for generating an output signal based on an internal data state of a semiconductor device, comprising:
   one or more pull-up units for selectively driving a voltage level of the output signal to a first voltage; and
   one or more pull-down units for driving a voltage level of the output signal to a second voltage; wherein
   the pull-up units are controlled by one or more pull-up control signals including at least one up-driving strength control signal that controls strength at which a pull-up unit drives voltage level of the output signal to the first voltage, independently of the pull-down units, the pull-down units controlled by one or more pull-down control signals including at least one down-driving strength control signal that controls strength at which a pull-down unit drives voltage level of the output signal to the second voltage.

2. The output driver circuit of claim 2, wherein:
   the pull-up units drive the voltage level of the output signals to the first voltage based on a first data signal; and
   the pull-down units drive the voltage level of the output signal to a second voltage based on the second data signal.

3. The output driver circuit of claim 2, wherein each pull-up unit includes:
   a first data signal receiving circuit for receiving the first data signal and outputting a pull-up driving signal based on the received first data signal; and
   a pull-up transistor for driving the voltage level of the output signal to the first voltage based on the pull-up driving signal.

4. The output driver circuit of claim 3, wherein each pull-down unit includes:
   a second data signal receiving circuit for receiving the second data signal and outputting a pull-down driving signal based on the received second data signal; and
   a pull-down transistor for driving the voltage level of the output signal to the second voltage based on the pull-down driving signal.

5. The output driver circuit of claim 1, wherein the first voltage corresponds to a power supply voltage and the second voltage corresponds to a ground voltage.

6. The output driver circuit of claim 1, wherein the pull-up units includes N+1 pull-up units, and the pull-down units includes N+1 pull-down units, N being a number greater than or equal to 1.

7. The output driver circuit of claim 1, wherein
   the up-driving strength control signals include N+1 up-driving strength control signals, and the down-driving strength control signals include N+1 down-driving strength control signals, N being a number greater than or equal to 1; and wherein
   the pull-up units include N+1 pull-up units, each of the N+1 pull-up units being controlled by a corresponding one of the N+1 up-driving strength control signals; and wherein
   the pull-down units include N+1 pull-down units, each of the N+1 pull-down units being controlled by a corresponding one of the N+1 down-driving strength control signals.

8. The output driver circuit of claim 7, wherein
   the N+1 pull-up units include an $(n+1)^{th}$ pull-up unit, n being a number within a range of 0 . . . N, the $(n+1)^{th}$ pull-up unit including:
   a first data receiving circuit for receiving the first data signal, the first data receiving circuit outputting a pull-up driving signal based on the received first data signal;
   a pull-up transistor for driving the voltage level of the output signal to the first output voltage based on the pull-up driving signal; and
   a pull-up unit control transistor, which is turned on or off based on an $(n+1)^{th}$ up-driving strength control signal of the N+1 up-driving strength control signals, the pull-up transistor being enabled to drive the voltage level of the output signal to the first voltage when the pull-up unit control transistor is turned on, the pull-up transistor being disabled from driving the voltage level of the output signal to the first voltage when the pull-up unit control transistor is turned off.

9. The output driver circuit of claim 8, wherein the $(n+1)^{th}$ pull-up unit includes:
   a first node connecting the first data receiving circuit to the pull-up transistor, the pull-up driving signal corresponding to the voltage level at the first node; and
   a second voltage node at which the second voltage is applied; wherein
      the pull-up unit control transistor, when turned on, electrically blocks a path connecting the first node and the second voltage node, to enable the pull-up transistor to drive the voltage level of the output signal to the first voltage.

10. The output driver circuit of claim 8, wherein the size of the pull-up transistor is proportional to $S*2^n$, S being a size of the pull-up transistor of a first pull-up unit of the N+1 pull-up units.

11. The output driver circuit of claim 8, wherein the first voltage corresponds to a power supply voltage, and the second voltage corresponds to a ground voltage.

12. The output driver circuit of claim 7, wherein
   the N+1 pull-down units include an (n+1) pull-down unit, n being a number within a range of 0 ... N, the $(n+1)^{th}$ pull-down unit including:
      a second data receiving circuit for receiving the second data signal, the second data receiving circuit outputting a pull-down driving signal based on the received first data signal;
      a pull-down transistor for driving the voltage level of the output signal to the second output voltage based on the pull-down driving signal; and
      a pull-down unit control transistor, which is turned on or off based on an $(n+1)^{th}$ down-driving strength control signal of the N+1 down-driving strength control signals, the pull-down transistor being enabled to drive the voltage level of the output signal to the second voltage when the pull-down unit control transistor is turned off, the pull-down transistor being disabled from driving the voltage level of the output signal to the second voltage when the pull-down unit control transistor is turned on.

13. The output driver circuit of claim 12, wherein the $(n+1)^{th}$ pull-down unit includes:
   a second node connecting the second data receiving circuit to the pull-down transistor, the pull-down driving signal corresponding to the voltage level at the second node; and
   a first voltage node at which the first voltage is applied; wherein
      the pull-down unit control transistor, when turned on, blocks a path connecting the second node and the first output voltage node, to enable the pull-down transistor to drive the voltage level of the output signal to the second voltage.

14. The output driver circuit of claim 12, wherein a size of the pull-down transistor is proportional to $S*2^n$, S being a size of the pull-down transistor of a first pull-down unit of the N+1 pull-down units.

15. The output driver circuit of claim 12, wherein the first voltage corresponds to a power supply voltage, and the second voltage corresponds to a ground voltage.

16. The output driver circuit of claim 2, wherein an up-slew rate of the output signal is controlled independently from a down-slew rate of the output signal, the up-slew rate being a rate at which the pull-up units drive the output signal from the second voltage to the first voltage, the down-slew rate being a rate at which the pull-down units drive the output signal from the first voltage to the second voltage.

17. The output driver circuit of claim 16, wherein
   the pull-up control signals include an up-slew rate control signal used by the pull-up units for controlling the up-slew rate of the output signal, and
   the pull-down control signals include a down-slew rate control signal used by the pull-down units for controlling the down-slew rate of the output signal.

18. The output driver circuit of claim 17, wherein each pull-up unit includes:
   a first data receiving circuit for receiving the first data signal and outputting a pull-up driving signal based on the received first data signal;
   a pull-up transistor in communication with the first data receiving circuit for driving the voltage level of the output signal to the first voltage based on the pull-up driving signal received from the first data receiving circuit; and
   an up-slew rate control transistor operatively connected to the first data receiving circuit for controlling a rate at which the pull-up transistor drives the voltage level of the output signal to the first voltage level.

19. The output driver circuit of claim 18, wherein
   the up-slew rate control transistor receives the up-slew rate control signal; and
   a turn-on resistance of the up-slew rate control transistor decreases as a voltage level of the up-slew rate control signal increases, thereby causing the pull-up transistor to drive the voltage level of the output signal to the first voltage more quickly.

20. The output driver circuit of claim 19, wherein each pull-down unit include:
   a second data receiving circuit for receiving the second data signal and outputting a pull-down driving signal based on the received second data signal;
   a pull-down transistor in communication with the second data receiving circuit for driving the voltage level of the output signal to the second output voltage based on the pull-down driving signal received from the second data receiving circuit; and
   a down-slew rate control transistor operatively connected to the second data receiving circuit for controlling a rate at which the pull-down transistor drives the voltage level of the output signal to the second voltage.

21. The output driver circuit of claim 20, wherein
   the down-slew rate control transistor receives the down-slew rate control signal, and
   a turn-on resistance of the down-slew rate control transistor decreases as a voltage level of the down-slew rate control signal increases, thereby causing the pull-down transistor to drive the voltage level of the output signal to the second voltage more quickly.

22. The output driver circuit of claim 17, wherein
   the output driver circuit further comprises a digital-analog converter for receiving a digital up-slew rate control code and a digital down-slew rate control code,
   the digital-analog converter converts the received digital up-slew rate control code into the up-slew rate control signal, the up-slew control signal having an analog voltage level,
   the digital-analog converter converts the received down-slew rate control code into the down-slew rate control signal, the down-slew control signal having an analog voltage level.

23. The output driver circuit of claim 17, wherein
the up-driving strength control signals include N+1 up-driving strength control signals, and the down-driving strength control signals include N+1 down-driving strength control signals, N being a number greater than or equal to 1;
the pull-up units include N+1 pull-up units, each of the N+1 pull-up units being controlled by a corresponding one of the N+1 up-driving strength control signals, and
the pull-down units include N+1 pull-down units, each of the N+1 pull-down units being controlled by a corresponding one of the N+1 down-driving strength control signals.

24. The output driver circuit of claim 23, wherein
the N+1 pull-up units include an $(n+1)^{th}$ pull-up unit, n being a number within a range of 0 ... N, the $(n+1)^{th}$ pull-up unit including:
a first data receiving circuit for receiving the first data signal and outputting a pull-up driving signal based on the received first data signal;
a pull-up transistor in communication with the second data receiving circuit for driving the voltage level of the output signal to the first output voltage based on the pull-up driving signal received from the first data receiving circuit;
an up-slew rate control transistor operatively connected to the first data receiving circuit for controlling a rate at which the pull-up transistor drives the voltage level of the output signal to the first voltage level based on the up-slew rate control signal; and
a pull-up unit control transistor operatively connected to the up-slew rate control transistor and in communication with the pull-up transistor, which is turned on or off based on an $(n+1)^{th}$ up-driving strength control signal of the N+1 up-strength control signals, the pull-up transistor being enabled to drive the voltage level of the output signal to the first voltage when the pull-up unit control transistor is turned on, the pull-up transistor being disabled from driving the voltage level of the output signal to the first voltage when the pull-up unit control transistor is turned off.

25. The output driver circuit of claim 23, wherein the N+1 pull-down driving units include an $(n+1)^{th}$ pull-down unit, n being a number within a range of 0 ... N, the $(n+1)^{th}$ pull-down unit including,
a second data receiving circuit for receiving the second data signal and outputting a pull-down driving signal based on the received second data signal;
a pull-down transistor in communication with the second data receiving circuit for driving the voltage level of the output signal toward the second output voltage based on the pull-down driving signal received from the second data receiving circuit;
a down-slew rate control transistor operatively connected to the second data receiving circuit for controlling a rate at which the pull-down transistor drives the voltage level of the output signal to the second voltage based on the down-slew rate control signal; and
a pull-down unit control transistor operatively connected to the down-slew rate control transistor and in communication with the pull-down transistor, which is turned on or off based on an $(n+1)^{th}$ down-driving strength control signal of the N+1 down-driving strength control signals, the pull-down transistor being enabled to drive the voltage level of the output signal to the second voltage when the pull-down unit control transistor is turned off, the pull-down transistor being disabled from driving the voltage level of the output signal to the second voltage when the pull-down unit control transistor is turned on.

26. The output driver circuit of claim 16, further comprising:
a pre-driver device for receiving an output enable signal, the pre-driver device generating the first and second data signals based on the output enable signal and outputting the first and second data signals to the pull-up units and pull-down units, respectively, wherein
the output signal is generated to have a voltage level corresponding to an internal data state of the semiconductor device when the output enable signal is activated, and
the output signal is generated to have a voltage level corresponding to a tri-state when the output enable signal is not activated.

27. The output driver circuit of claim 26, wherein
the first and second data signals each have a logic level corresponding to the internal data state when the output enable signal is activated, thereby causing the pull-up units or the pull-down units to drive the output signal to the voltage level corresponding to the internal data state, and
the first data signal has a different logic level from the second data signal when the output enable signal is not activated, thereby disabling the pull-up units and the pull-down units from driving the output signal.

28. The output driver circuit of claim 2, further comprising:
a pre-driver device for receiving an output enable signal, the pre-driver device generating the first and second data signals based on the output enable signal and outputting the first and second data signals to the pull-up units and pull-down units, respectively,
the output signal is generated to have a voltage level corresponding to an internal data state of the semiconductor device when the output enable signal is activated, and
the output signal is generated to have a voltage level corresponding to a tri-state when the output enable signal is not activated.

29. The output driver circuit of claim 28, wherein the voltage level corresponding to the tri-state is between the voltage level corresponding to a high internal data state and the voltage level corresponding to a low internal data state.

30. The output driver circuit of claim 28, wherein
the first and second data signals each have a logic level corresponding to the internal data state when the output enable signal is activated, thereby causing the pull-up units or the pull-down units to drive the output signal to the voltage level corresponding to the internal data state, and
the first data signal has a different logic level from the second data signal when the output enable signal is not activated to disable the pull-up units and the pull-down units from driving the output signal.

31. The output driver circuit of claim 30, wherein the pull-up units drive the output signal when the internal data state is high and the output enable signal is activated.

32. The output driver circuit of claim 30, wherein the pull-down units drive the output signal when the internal data state is low and the output signal is activated.

33. The output driver circuit of claim 30, wherein the pre-driver further comprises:
an active signal latch unit for latching the output enable signal and an inverted output enable signal when the internal clock is in a first state, the output enable signal being latched in one of an activated state and a non-activated state; and a logic unit for generating the first and second data signals based on the latched output enable signal, the first and second data signals having a logic level corresponding to the internal data when the output enable signal is in the activated state, the first data signal having a different logic level from the second data signal when the output enable signal is in the non-activated state.

34. The output driver circuit of claim 33, wherein the internal data state is determined from two internal data signals, a data rate of each of the internal data signals being no more than half of a data rate of the output signal, and each of the first and second data signals has a data rate being substantially equal to the data rate of the output signal.

35. The output driver circuit of claim 34, wherein the two internal data signals include a first and second internal data signal, the internal data state being determined by the first internal data signal when an internal clock signal has a high logic level, the internal data state being determined by the second internal data signal when the internal clock signal is low.

36. An output driver circuit for generating an output signal based on an internal data state of a semiconductor device, comprising:

at least one pull-up unit for selectively driving a voltage level of the output signal to a first voltage, the at least one pull-up unit controlled by at least one up-driving strength control signal that controls strength at which a pull-up unit drives voltage level of the output signal to the first voltage, and by at least one up-slew rate control signal used for controlling an up-slew rate of the output signal; and at least one pull-down unit for driving a voltage level of the output signal to a second voltage, the at least one pull-down unit controlled by at least one down-driving strength control signal that controls strength at which a pull-down unit drives voltage level of the output signal to the second voltage, and by at least one down-slew rate control signal used for controlling a down-slew rate of the output signal.

37. The output driver circuit of claim 36, wherein the up-slew rate is a rate at which the pull-up units drive the output signal from the second voltage to the first voltage, the down-slew rate being a rate at which the pull-down units drive the output signal from the first voltage to the second voltage, the at least one up-driving strength control signal and the at least one down-driving strength control signal are independently generated so that the pull-up units are controlled independently of the pull-down units, and the up-slew rate of the output signal is controlled independently from the down-slew rate of the output signal.

* * * * *